United States Patent [19]

McGill

[11] Patent Number: 4,528,418
[45] Date of Patent: Jul. 9, 1985

[54] PHOTORESPONSIVE SEMICONDUCTOR DEVICE HAVING A DOUBLE LAYER ANTI-REFLECTIVE COATING

[75] Inventor: John McGill, Rochester, Mich.

[73] Assignee: Energy Conversion Devices, Inc., Troy, Mich.

[21] Appl. No.: 582,984

[22] Filed: Feb. 24, 1984

[51] Int. Cl.³ .................... H01L 31/04; H01L 31/18
[52] U.S. Cl. .................... 136/256; 29/572; 136/249; 136/258; 357/30; 357/52; 427/74
[58] Field of Search .......... 136/256, 258 AM, 249 TJ; 357/30, 52; 427/74; 29/572

[56] References Cited

U.S. PATENT DOCUMENTS

| 4,388,482 | 6/1983 | Hamakawa et al. | 136/258 AM |
| 4,389,534 | 6/1983 | Winterling | 136/256 |
| 4,441,113 | 4/1984 | Madan | 357/2 |

OTHER PUBLICATIONS

R. Meaudre & J. Tardy; "Wide Optical Gap, Undoped, Photoconductive a—$Si_xH_{1-x}$:H Prepared by D. C. Sputtering"; *Solid State Comms.;* 48, 2, pp. 117–119 (1983).

H. Watanabe, et al; "Electrical Properties of Glow Discharge Amorphous $SiN_xH$ Thin Films"; *Thin Solid Films,* 106 (1983): pp. 263–274.

S. M. Pietruszko, et al; "Effect of Nitrogen On Glow Discharge Amorphous Films"; *Philo. Mag.* B (1981), vol. 43, No. 2, pp. 357–363.

*Primary Examiner*—Aaron Weisstuch
*Attorney, Agent, or Firm*—Richard M. Goldman

[57] ABSTRACT

Disclosed is an improved dual layer anti-reflective coating for use in a photoresponsive semiconductor device, and a device incorporating the coating. The coating has a uniformly low parasitic absorbance in the range of about 475 to 600 nanometers. The dual layer has an incident light layer and an intermediate layer. The intermediate layer is formed of a silicon alloy material having at least one band gap widening element incorporated therein. The index of refraction of the intermediate layer has an index of refraction intermediate the indexes of the incident light layer and the underlying photoresponsive semiconductor device.

24 Claims, 5 Drawing Figures

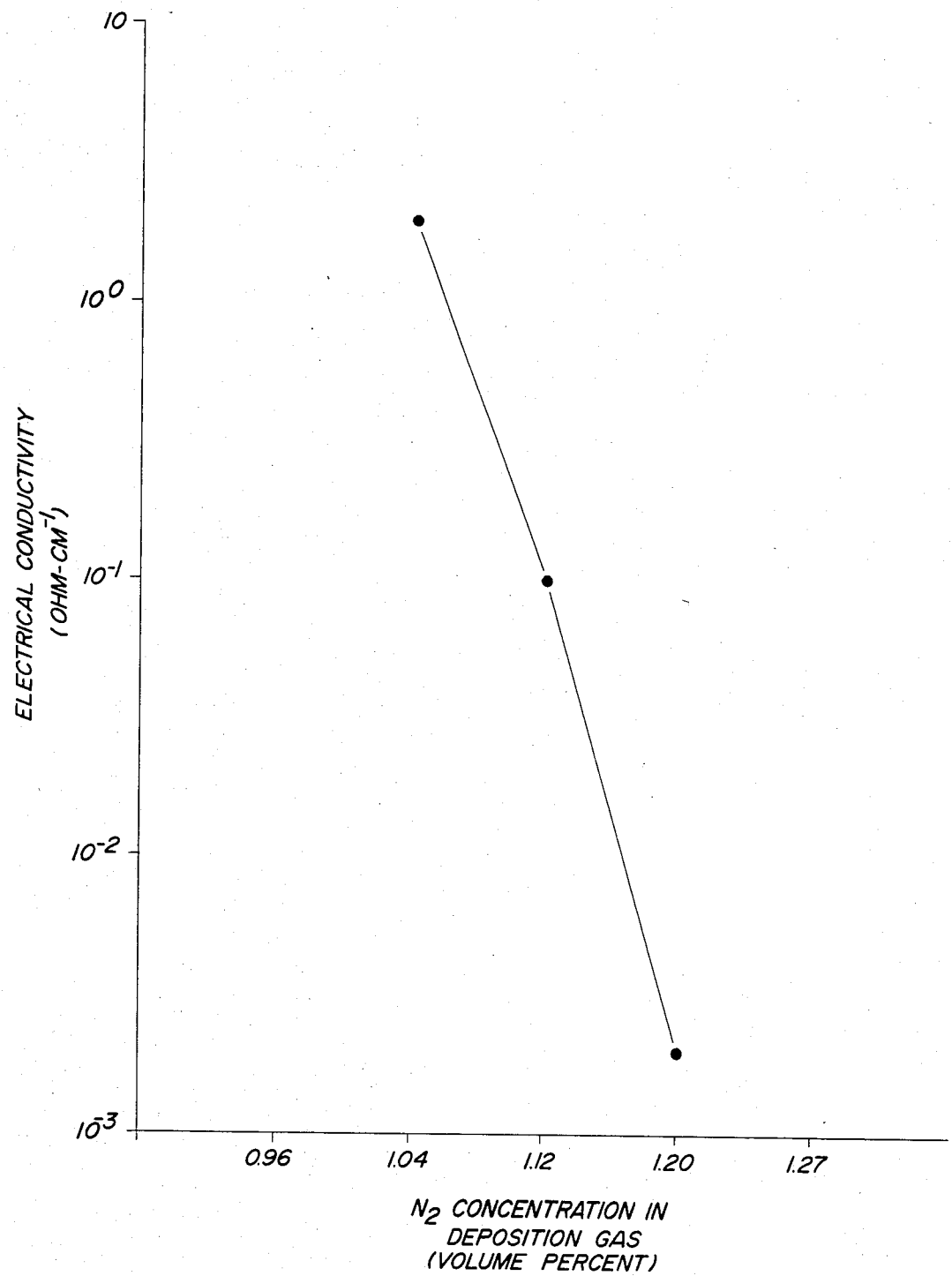

PHOTORESPONSIVE SEMICONDUCTOR DEVICE HAVING A DOUBLE LAYER ANTI-REFLECTIVE COATING

FIELD OF THE INVENTION

This invention relates generally to photoresponsive semiconductor devices, e.g. photoconductors and photovoltaic cells. Disclosed herein is an improved surface coating, layer, or film for reducing the parasitic light absorption, i.e., absorption and reflection, and increasing the bandwidth of the incident light on the subjacent photoresponsive body.

In its broadest sense, this invention is directed to photoresponsive semiconductor devices having a coating, film, or layer that reduces absorption over the entire visible spectrum and reflection over the range of 475 to 600 nanometers, allowing relatively high transmission of light to the semiconductor device, esp. in the range of 475 to 600 nanometers. The photoresponsive device may be a photoconductive device, a photovoltaic device, or an integrated device incorporating a photoconductor element or a photovoltaic element.

BACKGROUND OF THE INVENTION

Photoresponsive devices, such as photovoltaic cells, photodetectors, photoconductors, and the like depend on incident light, frequently within a narrow bandwidth, for efficient operation. These devices carry substantially transparent films, coatings, and layers thereon, e.g. conducting electrodes, conducting contacts, etc. thereon. Incident light may be transmitted through a transparent medium, reflected thereby, or absorbed thereby. Transmitted light is the incident light minus the sum of reflected and absorbed light. As used herein, the sum of reflected and absorbed light is referred to as parasitic absorption. While apparently transparent, the above mentioned films, coatings, and layers have parasitic optical absorption associated therewith. That is, these films, coatings, and layers absorb and reflect light that would otherwise reach the photoresponsive device. This reduces the efficiency of the underlying photoresponsive device.

Accordingly, it can be seen that there exists a need for an anti-reflection, light bandwidth widening coating, film, or layer, and a method of depositing such coatings, films, or layers on semiconductor devices which will not diminish the desirable photoresponsive properties of the semiconductor material of the semiconductor device. This need is especially great in large area photovoltaic cells, where a small decrement in output per unit area, multiplied over a large area, represents a large absolute loss of output due to parasitic light absorption.

Recently, considerable efforts have been made to develop systems for depositing amorphous semiconductor alloy materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions.

It is now possible to prepare amorphous silicon alloys by glow discharge deposition or vacuum deposition techniques, said alloys possessing (1) acceptable concentrations of localized states in the energy gaps thereof, and (2) high quality electronic properties. Such techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374, to Stanford R. Ovshinsky and Masatsugu Izu, which issued on Aug. 12, 1980, also entitled Amorphous Semiconductors Equivalent To Crystalline Semiconductors; and U.S. patent application Ser. No. 423,424 of Stanford R. Ovshinsky, David D. Allred, Lee Walter, and Stephen J. Hudgens entitled Method of Making Amorphous Semiconductor Alloys and Devices Using Microwave Energy. As disclosed in these patents and applications, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498, issued Aug. 16, 1960. The multiple cell structures therein disclosed utilized p-n junction crystalline semiconductor devices. Essentially, the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

Unlike crystalline silicon which is limited to batch processing for the manufacture of solar cells, amorphous silicon alloys can be deposited in multiple layers over large area substrates to form solar cells in a high volume, continuous processing sytem. Such continuous processing systems are disclosed in U.S. Pat. No. 4,400,409 for A Method Of Making P-Doped Silicon Films and Devices Made Therefrom; Ser. No. 244,386, filed Mar. 16, 1981 for Continuous Systems For Depositing Amorphous Semiconductor Material, now U.S. Pat. No. 4,410,558; and Ser. No. 306,146, filed Sept. 28, 1981 for Multiple Cell Deposition And Isolation System And Method, now U.S. Pat. No. 4,438,723, Ser. No. 359,825, filed Mar. 19, 1982 for Method And Apparatus For Continuously Producing Tandem Amorphous Photovoltaic Cells, now U.S. Pat. No. 4,492,181; and Ser. No. 460,629 filed Jan. 14, 1983 for Method And Apparatus For Continuously Producing Tandem Amorphous Photovoltaic Cells, now U.S. Pat. No. 4,485,125. As disclosed in the above patents, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. The resulting photovoltaic device is referred to, by order of deposition, as a p-i-n device.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, photoconductors, or the like. Additionally, by making multiple passes through the succession of deposition chambers, or by providing an additional array of deposition chambers, multiple stacked cells of various configurations may be obtained.

In many cases, it is desirable to increase the fraction of light incident on the device that passes through nonphotoresponsive layers to the photoresponsive regions of the device. This may be accomplished by reducing parasitic light absorption, i.e., reflection and absorption, and increasing the bandwidth of light transmitted through the nonphotoresponsive layers.

One attempt to reduce parasitic absorption is disclosed in U.S. Pat. No. 4,389,534 to Gerhard Winterling for Amorphous Silicon Solar Cell Having Improved Antireflection Coating. As therein described, a layer of polycrystalline material is interposed between the transparent conductive oxide layer and the amorphous silicon photoresponsive device. This layer is formed of polycrystalline silicon. The polycrystalline layer introduces additional, difficult processing steps into the fabrication of the device, and could convert underlying amorphous silicon to polycrystalline or micro crystalline form. It is desirable to reduce parasitic absorption without providing a layer of polycrystalline silicon between the amorphous silicon layers and the transparent conductive oxide. Accordingly, the instant invention fulfills a long felt need in the production of semiconductor devices in general, and has special significance in the production of amorphous photovoltaic devices.

These and other advantages of the instant invention will become apparent from the drawings, the detailed description of the invention and the claims which follow.

BRIEF SUMMARY OF THE INVENTION

The present invention comprises an improved photoresponsive semiconductor device characterized by an improved dual layer coating thereon for substantially reducing reflection, absorption, and parasitic optical absorption, while broadening the bandwidth of the light transmitted therethrough, and by a method of depositing the coating. The coating is characterized by a light incident layer and a layer intermediate the light incident layer and the underlying photoresponsive semiconductor materials, which intermediate layer may be the outermost photoresponsive layer of the photoresponsive semiconductor device. The intermediate layer has an index of refraction, measured at 550 nanometers, that is intermediate the indices of refraction of the light incident layer and the semiconductor photoresponsive device. The index of refraction of the intermediate layer is greater than the index of refraction of the light incident layer and less than the index of refraction of the semiconductor photoresponsive device. The intermediate layer is formed of a silicon alloy material including a band gap widening element for increasing the band gap thereof above the band gap of the material of the underlying photoresponsive device and for decreasing the index of refraction thereof. The concentration of band gap widening element is optimized with respect to layer thickness, index of refraction, and electrical conductivity. In a preferred embodiment, the thicknesses and indices of refraction of the light incident layer and the intermediate layer are adjusted to increase the bandwidth of incident light transmitted therethrough, i.e. from the prior art bandwidth of 525 to 575 nanometers to a bandwidth of approximately 475 to approximately 600 nanometers.

BRIEF DESCRIPTION OF THE DRAWINGS

FIG. 5 is a graph of deposition gas nitrogen content versus electrical conductivity for a silicon alloy material useful in providing one layer of the dual layer antireflective coating of the invention.

DETAILED DESCRIPTION OF THE INVENTION

I. THE PHOTOVOLTAIC DEVICE

Figure 1:
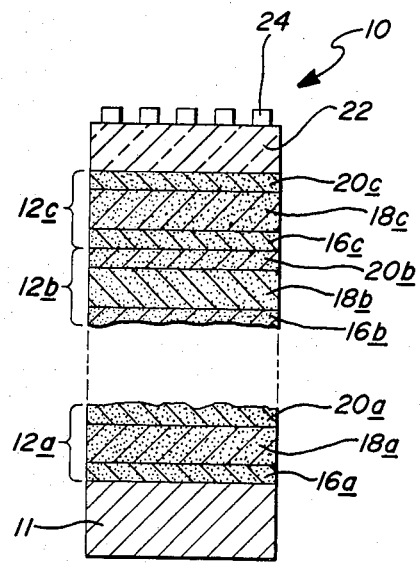
FIG. 1 is a fragmentary, cross-sectional view of a tandem photovoltaic cell comprising a plurality of p-i-n type cells, each layer of the cells including an amorphous semiconductor alloy.

Referring now to the drawings and particularly to FIG. 1, a tandem photovoltaic cell formed of a plurality of successive p-i-n layers, each of which include a semiconductor alloy, is shown generally by the numeral 10.

More particularly, FIG. 1 shows a p-i-n type photovoltaic device such as a solar cell made up of individual p-i-n type cells 12a, 12b, and 12c. Below the lowermost cell 12a is a substrate 11, which (1) forms the second surface of the cell 10, (2) functions as the bottom electrode, (3) may be transparent or formed from a metallic material such as stainless steel, aluminum, tantalum, molybdenum, or chromium, with or without an insulating layer thereon, or an insulating material such as glass with or without metallic particles embedded therein or (4) may be a reflector. Although certain applications may require a thin oxide layer and/or a series of base contacts prior to deposition of the semiconductor material, for purposes of this application, the term, "substrate" shall include not only a flexible film, but also any elements added thereto by preliminary processing. The instant invention provides a method for depositing these elements, as will become apparent from the description which follows.

Each of the cells, 12a, 12b, and 12c are fabricated with an amorphous semiconductor body containing at least a silicon or germanium alloy. Each of the semiconductor bodies includes an n-type conductivity semiconductor layer 20a, 20b, and 20c; an intrinsic semiconductor layer 18a, 18b, and 18c; and a p-type conductivity semiconductor layer 16a, 16b, and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers, a further deposition process may either be performed in a separate environment or as a part of a continuous process. In this step, a TCO (transparent conductive oxide) layer 22, formed in the preferred embodiment of indium tin oxide, also referred to herein as the top or upper electrode or first surface of the device 10, is deposited atop the semiconductor material.

While the TCO layer 22 has anti-reflection and anti-dispersion properties, the instant invention is directed toward an intermediate coating 20c providing additional anti-reflection properties and broadening the bandwidth of the incident light reaching photovoltaic cell 12c.

A metallic pattern in the form of an electrode grid 24 may be applied to the device where the cell is of a sufficiently large area, or if the conductivity of the TCO layer 22 is insufficient. The grid 24 shortens the carrier path through the TCO and thus increases the conduction efficiency.

Figure 2:
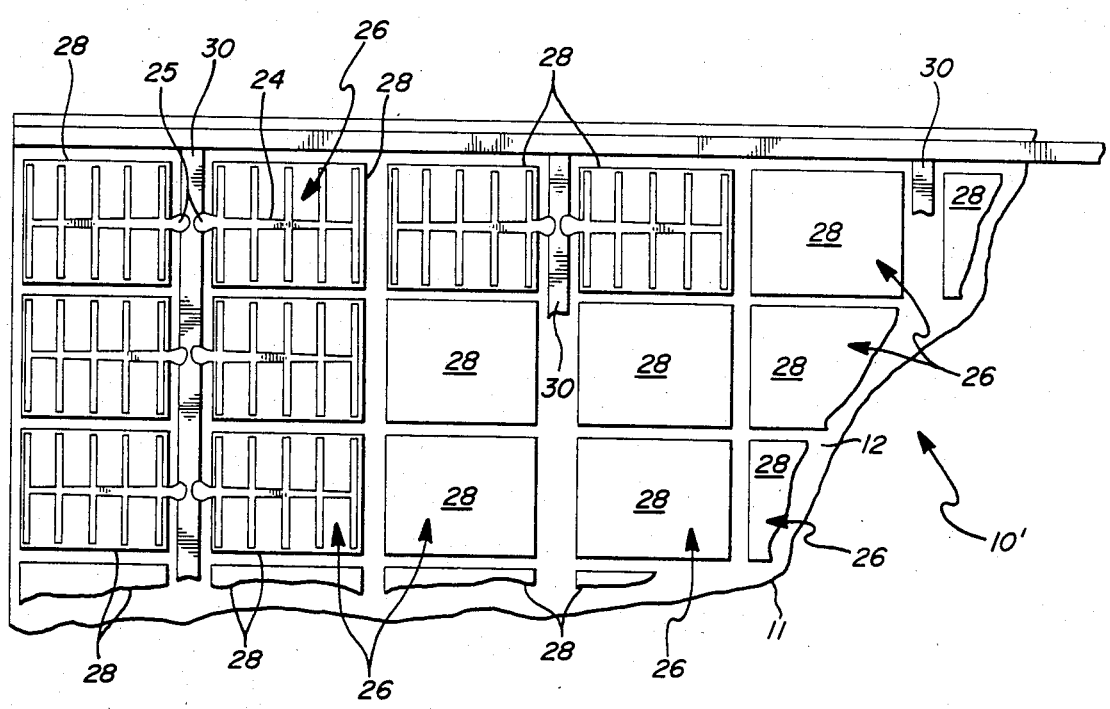
FIG. 2 is a fragmentary top plan view of a large area photovoltaic device comprising a plurality of small area isolated cells, each of which includes an electrically conductive grid pattern formed according to the principles of the instant invention.

FIG. 2 is a fragmentary top plan view of a large area photovoltaic device 10' generally similar to the device depicted in cross section in FIG. 1. As can be seen from FIG. 2, the large area device 10' includes a continuous, large area substrate 11 having a continuous layer of semiconductor material 12 deposited thereon. The surface of the semiconductor material 12 of the large area photovoltaic device 10' has a plurality of electrically isolated portions 26 formed thereon, each of said isolated portions 26 adapted to contribute to the total electrical output of the large area device 10'.

As should be apparent, each of the isolated portions 26 share a common continuous substrate 11 which forms a common bottom electrode, hereinafter also referred to as the "second surface". The electrically isolated portions 26 of the semiconductor material 12 are formed by discrete regions 28 of the TCO (transparent conductive oxide) material which has been provided atop the semiconductor material 12 so that each of these discrete regions 28 functions as the upper electrode of an individual small area photovoltaic cell. The individual small area cells 26 thus formed are electrically isolated from adjacent small area cells because the relatively high conductivity TCO layer 22 collects current from the semiconductor material 12 directly thereunder, while the high lateral electrical resistivity of the semiconductor material 12 prevents electrical current from flowing laterally between the discrete regions 26.

Deposited atop each of the electrically isolated portions 26 is a current collection grid 24, previously described, which functions to provide a low resistance current path across each of the transparent conductive oxide segments 28 formed on the large area device 10', thereby decreasing electrical resistance further, and improving current collection. The grid 24 of each electrically isolated small area portion 26 is connected to a system of busbars 30 which convey photogenerated current collected from each of the portions 26 to a central collection point. The grids 24 are shown connected to the busbars 30 by connectors 25, such as dots of silver paste. In some applications it is desirable not to initially connect the grid 24 to the busbars 30 thus allowing for electrical testing of each isolated portion 26 so as to only connect the portions 26 found to be electrically operable (provide a predetermined electric current).

The busbars 30, the connectors 25 and the conductive grid 24 are desirably fabricated of a material having a relatively high electrical conductivity such as a metallic material.

II. THE ANTI-REFLECTIVE COATING

The dual layer anti-reflective coating of the invention incorporates a light incident layer, as the TCO (transparent conductive oxide) layer 22 and an intermediate layer 20c which is the outermost photoresponsive layer of the photoresponsive semiconductor device. The anti-reflective coating is referred to as a dual layer coating because of the anti-reflective synergism between the light incident layer, which may be the transparent conductive oxide layer 23, and the photoactive semiconductor layer 20c beneath and in contact with the light incident layer. The combination of the light incident layer 22 and the intermediate layer 20c, and the properties thereof substantially reduce parasitic optical absorption, i.e., reflection, and absorption, and broaden the bandwidth of the light effectively reaching the photoresponsive semiconductor material, 18c.

The intermediate layer 20c is an amorphous silicon alloy material having at least one band gap widening element incorporated therein. Silicon alloy materials, such as Si:H:F, and Si:H:F:P, have a band gap of 1.7 to 1.8 electron volts, and are prepared by the glow discharge deposition of a deposition gas containing $SiF_4$, $PH_3$, $H_2$, and $N_2$. The preferred silicon alloy material for the intermediate layer 20c is a nitrogenated, phosphine doped, silicon alloy, Si:H:F:N:P, having a band gap of 2.0 to 2.4 electron volts, sufficient electrical conductivity to allow current flow between the incident layer 22 and associated electrode grid 24, and the photoresponsive semiconductor device 12c, and an index of refraction intermediate the indices of refraction of the incident layer 22 and the next subjacent layer 18c of the photoresponsive semiconductor device 12c.

Proper selection of the relative thickness of the incident layer 22 and intermediate layer 20c, and the indices of refraction of the incident layer 22, the intermediate layer 20c, and the next subjacent layer 18c of the semiconductor device 12c, provides additional light energy to the photoresponsive semiconductor device 12c in the optimum operating range thereof. This is accomplished by two processes. One process, referred to as reducing reflection, is a reduction of parasitic optical absorption, including reflection and absorption. The other process is a broadening of the bandwidth of the incident light reaching the next subjacent layer 18c of the photoresponsive device 12c. The bandwidth broadening process increases the bandwidth of relatively low parasitic adsorption from a 522 to 575 nanometer range to a broader 475 to 600 nanometer range. Moreover, this is accomplished as shown in FIG. 3, comparing an Si:H:F:N:P layer of the invention with an Si:H:F:P layer, without local reflection minima, or transmission maxima, at, e.g. 520 and 555 nanometers, and without a local reflection maximum or transmission minimum therebetween, but with relatively uniform transmission therebetween, and without increased attenuation or parasitic absorption of red and near-infrared.

Figure 3:
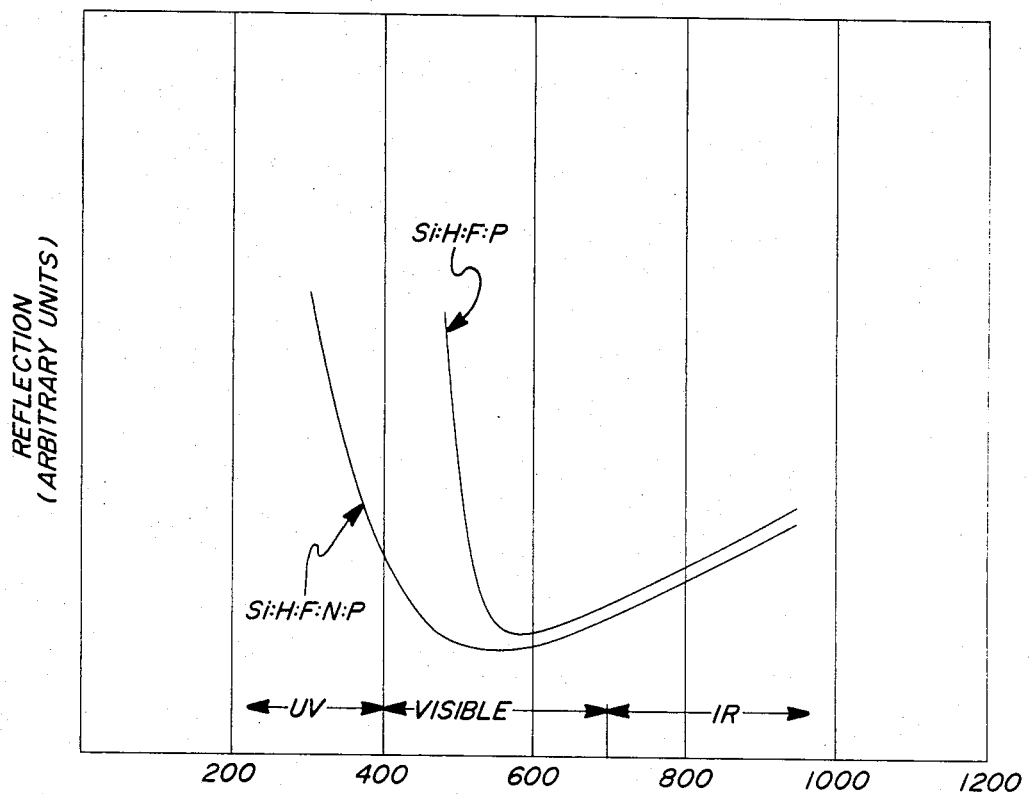
FIG. 3 is a graph of wavelength versus reflection for a dual layer anti-reflective coating of the invention.

FIG. 3 shows the light reflection versus wavelength characteristics of a dual layer anti-reflective coating of the invention. As there shown, the reflection is relatively uniform in the 475–600 nanometer range, and is not attenuated in the red to near-infrared range with respect to an intermediate layer 20c of narrower band gap.

The intermediate layer 20c has an index of refraction greater than the index of refraction of the light incident layer 22 and less than the index of refraction of the subjacent layer in contact therewith, e.g., intrinsic type conductivity layer 18c. That is, the index of refraction of intermediate layer 20c is intermediate the indices of refraction of the light incident layer 22 and the semiconductor device 12c, including the intrinsic layer 18c thereof.

Generally, when the light incident layer 22 is a transparent conductive oxide, e.g. (Indium Tin) oxide, the index of refraction thereof is about 1.8 to 2.0, and when the intrinsic layer 18c of the photoresponsive device 12c is an intrinsic silicon alloy material, e.g. Si:H, the index of refraction thereof is about 4.5 at 550 nanometers. Under these conditions the preferred index of refraction for the intermediate layer is from about 2.5 to about 3.3, and preferably about 3.0, all measured at 550 nanometers. In a preferred exemplification the index of refraction of the intermediate layer, 20c, should be the square root of the product of the indices of refraction of the light incident layer 22 and the intrinsic type conductivity layer 18c.

Figure 4:
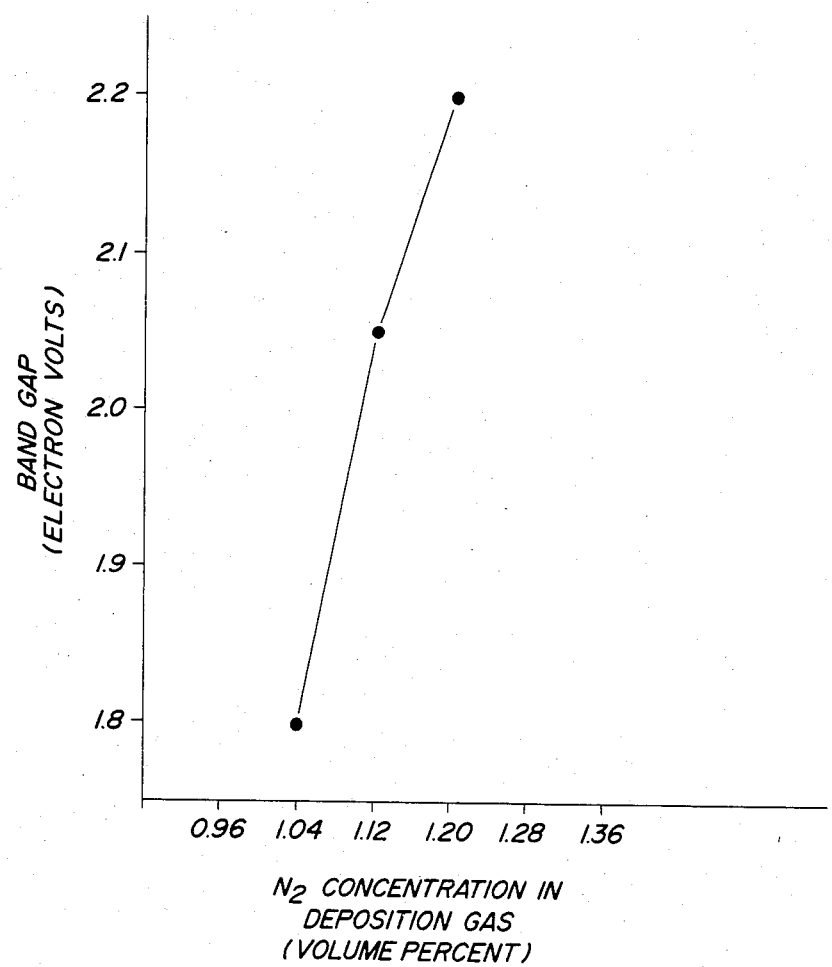
FIG. 4 is a graph of deposition gas nitrogen content versus band gap for a silicon alloy material useful in providing one layer of the dual layer anti-reflective coating of the invention.

FIG. 4 shows the band gap in electron volts (eV) as a function of nitrogen gas content of the deposition gas for a silicon alloy material, Si:H:F:N:P, formed by glow discharge deposition from a gas mixture of $SiF_4$, $PH_3$, $H_2$, and $N_2$. Nitrogen present in the deposition gas, increases the band gap of the resulting silicon alloy material. The intermediate layer 20c is formed of a silicon alloy material having a wider band gap than the intrinsic type conductivity layer 18c of the photoresponsive device 12c. The band gap of the silicon alloy material of the intermediate layer should be as wide as possible while retaining electrical conductivity. For the materials herein contemplated this is between 2.0 and 2.4 electron volts, and preferably about 2.2 electron volts.

The conductivity of the intermediate layer 20c should be high enough to permit the flow of electrical current therethrough between the incident light layer 22 and associated grid 24 and the photoresponsive semiconductor device, 12c. FIG. 5 shows the electrical conductivity as a function of nitrogen gas content of the deposition for a silicon alloy material, Si:H:F:N:P formed by glow discharge deposition from a gas mixture of $SiF_4$, $PH_3$, $H_2$ and $N_2$. Increasing nitrogen in the deposition gas reduces the electrical conductivity of the silicon alloy material. Preferably the silicon alloy material of the intermediate layer 20c has an electrical conductivity greater than $10^{-5}$ (ohm-cm)$^{-1}$.

The thickness of the two elements 20c, 22 of the dual layer anti-reflective coating should be such as to take advantage of the indices of refraction, electrical conductivities, and bandgaps to obtain the desired wavelength versus adsorption properties. Particularly good results have been found at an incident light layer thickness of about 450Å to 500Å and intermediate layer thickness of about 150Å to 250Å, and preferably about 200 Angstroms.

According to a further exemplification, the substrate 11 can be a reflector, e.g., a specular reflector or a diffuse reflector. With either type of reflector, light which has initially passed through the active region 12 or regions, 12a, 12b, 12c of the device 10 but which is unabsorbed or unused is redirected through the active regions 12a, 12b, 12c of the device. This provides increased photon absorption and charge carrier generation in the active region or regions 12a, 12b, 12c, thereby providing increased short circuit currents. In the case of a specular reflector, the unused light is generally redirected for one additional pass through the device active regions 12a, 12b, 12cl In the case of a diffuse reflector, the light is redirected through the active regions 12a, 12b, 12c, at angles sufficient to cause the redirected light to be substantially confined within the device 10. This provides multiple reflections of the redirected light in the active regions 12a, 12b, 12c. As a result, both specular and diffuse back reflectors 11 provide for increased short circuit currents and thus increased efficiencies. Additionally, since the directed light passes through the active regions 12a, 12b, 12c at an angle, the active regions 12a, 12b, 12c can be made thinner to reduce charge carrier recombination while maintaining efficient charge carrier generation and collection.

While the invention has been described with respect to certain preferred exemplifications and embodiments, it is not intended to limit the scope of the invention thereby, but solely by the claims appended hereto.

I claim:

1. An improved p.i.n. type photovoltaic device having a transparent conductive oxide light incident layer thereon and in contact with an outermost layer of n-type conductivity amorphous silicon alloy material of the device, wherein the said outermost layer of n-type conductivity silicon alloy material has an index of refraction intermediate to and substantially equal to the square root of the product of the indices of refraction of the light incident layer and of the subjacent semiconductor body, said alloy material including silicon, hydrogen, fluorine, nitrogen, and phosphorous for substantially reducing the reflection of light and broadening the band width in the optimum operating range of the p.i.n. type photovoltaic device, whereby additional light energy is provided to the p.i.n. type photovoltaic device.

2. The p.i.n. type photovoltaic device of claim 1 wherein the light incident layer comprises (indium-tin) oxide.

3. The p.i.n. type photovoltaic device of claim 1 wherein the light incident layer has an idex of refraction of about 1.8 at 550 nanometers.

4. The p.i.n. type photovoltaic device of claim 1 wherein the light incident layer is about 450 to 500 Angstroms thick.

5. The p.i.n. type photovoltaic device of claim 1 wherein the light incident layer is a 450 to 500 Angstroms thick layer of (indium-tin) oxide having an index of refraction of about 1.8 at 550 nanometers.

6. The p.i.n. type photovoltaic device of claim 1 wherein the outermost n-type conductivity silicon alloy material layer has an index of refraction of about 2.5 to 3.3 at 550 nanometers.

7. The p.i.n. type photovoltaic device of claim 6 wherein the outermost n-type conductivity silicon alloy material layer has an index of refraction of about 3.0 at 550 nanometers.

8. The p.i.n. type photovoltaic device of claim 1 wherein the outermost n-type conductivity silicon alloy material layer has an electrical conductivity of at least $10^{-5}$ (ohm-cm)$^{-1}$.

9. The p.i.n. type photovoltaic device coating of claim 1 wherein the outermost n-type conductivity silicon alloy material layer is from about 150 to about 250 Angstroms thick.

10. The p.i.n. type photovoltaic device of claim 9 wherein the outermost n-type conductivity silicon alloy material layer is about 200 Angstroms thick.

11. The p.i.n. type photovoltaic device of claim 1 wherein the outermost n-type conductivity silicon alloy material layer has a band gap of 2.0 to 2.4 electron volts.

12. The p.i.n. type photovoltaic device of claim 11 wherein the outermost layer of n-conductivity type silicon alloy material has a band gap of about 2.2 electron volts.

13. The p.i.n. type photovoltaic device of claim 1 wherein the outermost n-type conductivity silicon alloy material layer is a 200 Angstrom thick layer of a silicon alloy material comprising silicon, hydrogen, fluorine, nitrogen, and phosphorous, having a band gap of about 2.2 electron volts, an index of refraction of about 3.0 at 550 nanometers, and an electrical conductivity of at least $10^{-5}$ (ohm-cm)$^{-1}$.

14. The p.i.n. type photovoltaic device of claim 1 wherein the light incident layer has an index of refraction of about 1.8, the outermost layer of n-type conductivity silicon alloy material has an index of refraction of about 2.5 to 3.3 at 550 nanometers, and the subjacent semiconductor device has an index of refraction greater than 3.3 at 550 nanometers.

15. The p.i.n. type photovoltaic device of claim 1 wherein the anti-reflective coating has a substantially low, uniform, parasitic light absorbance between 475 and 600 nanometers.

16. A method of forming a photoresponsive semiconductor device comprising the steps of:
(a) forming a photoresponsive semiconductor layer;
(b) depositing an amorphous silicon alloy n-type conductivity semiconductor material layer, from a deposition gas comprising $SiF_4$, $H_2$, $N_2$, and $PH_3$, the silicon alloy material having a band gap widening element therein to provide a wider band gap than the responsive semiconductor layer, the silicon alloy material having a lower refractive index than the photoresponsive semiconductor layer; and
(c) depositing a light incident layer atop the silicon alloy material, the light incident layer having a lower index of refraction than the silicon alloy material, the index of refraction of the n-type conductivity silicon alloy material layer being approximately equal to the square root of the product of the indices of refraction of the light incident layer and the photoresponsive semiconductor layer.

17. The method of claim 16 wherein the silicon alloy material has an index of refraction of from about 2.5 to 3.3 at 550 nanometers.

18. The method of claim 16 wherein the silicon alloy material has an electrical conductivity of at least $10^{-5}$ (ohm-cm)$^{-1}$.

19. The method of claim 16 wherein the silicon alloy material has a band gap of about 2.0 to 2.4 electron volts.

20. The method of claim 16 comprising depositing the silicon alloy material to a thickness of about 200 angstroms.

21. The method of claim 16 comprising depositing the silicon alloy material from a gas stream containing $SiF_4$, $H_2$, $N_2$, and $PH_3$ whereby to form a deposit of silicon alloy material at least 200 angstroms thick having a band gap of 2.0 to 2.4 volts, an index of refraction of about 2.5 to 3.3. at 550 nanometers, and an electrical conductivity of at least $10^{-5}$ (ohm-cm)$^{-1}$.

22. The method of claim 16 comprising depositing a light incident layer of a transparent conductive oxide atop the silicon alloy material layer.

23. The method of claim 22 wherein the transparent conductive oxide is (indium-tin) oxide.

24. The method of claim 16 comprising depositing the light incident layer to a thickness of about 450 to 500 angstroms.

* * * * *